United States Patent
Murakami et al.

(10) Patent No.: US 9,498,945 B2
(45) Date of Patent: Nov. 22, 2016

(54) COMPONENT MOUNTING LINE AND COMPONENT MOUNTING METHOD

(71) Applicant: PANASONIC INTELLECTUAL PROPERTY MANAGEMENT CO., LTD., Osaka (JP)

(72) Inventors: Minoru Murakami, Yamanashi (JP); Masayuki Mantani, Yamanashi (JP); Toshiyuki Murakami, Yamanashi (JP); Takashi Katsuki, Yamanashi (JP); Takashi Yazawa, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/612,875

(22) Filed: Feb. 3, 2015

(65) Prior Publication Data

US 2015/0239229 A1    Aug. 27, 2015

(30) Foreign Application Priority Data

Feb. 26, 2014    (JP) .................................. 2014-034997

(51) Int. Cl.
*B41F 15/40*    (2006.01)
*B41F 15/08*    (2006.01)
(Continued)

(52) U.S. Cl.
CPC ............. *B41F 15/40* (2013.01); *B41F 15/085* (2013.01); *B41F 15/16* (2013.01); *B41F 15/18* (2013.01); *B41F 15/26* (2013.01); *H05K 3/1225* (2013.01); *H05K 3/1233* (2013.01); *H05K 13/0465* (2013.01); *H05K 3/3484* (2013.01)

(58) Field of Classification Search
CPC ........ B41F 15/08; B41F 15/14; B41F 15/40; B41F 15/16; B41F 15/18; B41F 15/26; B41F 15/085; H05K 3/1225; H05K 3/1233; H05K 3/3484; H05K 13/0465
See application file for complete search history.

(56) References Cited

U.S. PATENT DOCUMENTS

| | | | | |
|---|---|---|---|---|
| 5,873,939 | A * | 2/1999 | Doyle | ................... H05K 3/1216 101/123 |
| 2004/0033128 | A1* | 2/2004 | Kabeshita | .......... H05K 13/0061 29/740 |

(Continued)

FOREIGN PATENT DOCUMENTS

JP    2011-143640 A    7/2011

*Primary Examiner* — Jill Culler
*Assistant Examiner* — Marissa Ferguson Samreth
(74) *Attorney, Agent, or Firm* — Pearne & Gordon LLP

(57) ABSTRACT

A component mounting line has a screen printing apparatus and component mounting apparatuses. Each component mounting apparatus includes a first substrate carrying lane and a second substrate carrying lane, carries a first type substrate on which a first pattern has been printed in the first substrate carrying lane, performs a component mounting-relevant operation on the first type substrate, carries a second type substrate on which a second pattern has been printed in the second substrate carrying lane, and performs a component mounting-relevant operation on the second type substrate. The screen printing apparatus selects a type of the substrate to be carried in depending on whether a substrate is carried in the second component mounting apparatus downstream from the screen printing apparatus.

4 Claims, 15 Drawing Sheets

(51) Int. Cl.
*B41F 15/16* (2006.01)
*B41F 15/18* (2006.01)
*B41F 15/26* (2006.01)
*H05K 3/12* (2006.01)
*H05K 13/04* (2006.01)
*H05K 3/34* (2006.01)

(56) References Cited

U.S. PATENT DOCUMENTS

2011/0017080 A1\* 1/2011 Miyahara ............ B41F 15/0818
　　　　　　　　　　　　　　　　　　　　　101/123
2012/0085254 A1\* 4/2012 Nagao .................... B41F 15/08
　　　　　　　　　　　　　　　　　　　　　101/126

\* cited by examiner

COMPONENT MOUNTING LINE AND COMPONENT MOUNTING METHOD

CROSS REFERENCE TO RELATED APPLICATION(S)

The present disclosure relates to the subject matters contained in Japanese Patent Application No. 2014-034997 filed on Feb. 26, 2014, which are incorporated herein by reference in its entirety.

FIELD

An embodiment of the present invention relates to a component mounting line that includes a screen printing apparatus printing paste on a substrate and plural component mounting apparatuses arranged in series on the downstream side of the screen printing apparatus and performing a component mounting-relevant operation on the substrate on which the paste has been printed by the screen printing apparatus and a component mounting method thereof.

BACKGROUND

In the related art, a component mounting line is known which includes a screen printing apparatus printing paste on a substrate and plural component mounting apparatuses arranged in series on the downstream side of the screen printing apparatus so as to perform a component mounting-relevant operation on the substrate on which the paste has been printed by the screen printing apparatus. In a type of the component mounting line, two types of substrates are alternately printed by selectively performing a screen printing operation on two types of substrates with a single mask having a first pattern corresponding to a first type substrate and a second pattern corresponding to a second type substrate. The plural component mounting apparatuses installed on the downstream side of the screen printing apparatus carry the first type substrate in one substrate carrying lane out of two substrate carrying lanes, mount components on the first type substrate, carry the second type substrate in the other substrate carrying lane, and mount the components on the second type substrate (For example, see Patent Document 1).

Patent Document 1 is JP-A-2011-143640.

SUMMARY

However, in such a component mounting line, when a flow of one type of substrate is delayed due to an error or the like in one substrate carrying lane out of two substrate carrying lanes of a component mounting apparatus, the other type of substrate may not be carried out from the screen printing apparatus to the other substrate carrying lane even though there are no problems in the carrying state of the other substrate carrying lane", the production of the other type of substrates in the other substrate carrying lane may be adversely affected, and thus the productivity in the other substrate carrying lane which is not stopped may be lowered. That is, the screen printing apparatus alternately performs a printing operation on two types of substrates. Accordingly, when a flow of one type of substrates in one substrate carrying lane is delayed and the one type of substrate to be carried out to one substrate carrying lane is already carried in the screen printing apparatus, the one type of substrate cannot be carried out to one substrate carrying lane on the downstream side. Accordingly, although the carrying state of the other substrate carrying lane is not abnormal, the other type of substrate cannot be carried out from the screen printing apparatus to the other substrate carrying lane and the production of the other type of substrate in the other substrate carrying lane is adversely affected.

Therefore, an object of the embodiment is to provide a component mounting line and a component mounting method that can prevent degradation in the productivity in one substrate carrying lane even when carrying of a substrate in the other substrate carrying lane is delayed.

According the embodiment, there is provided a component mounting line including: a screen printing apparatus that prints paste on a substrate; and a plurality of component mounting apparatuses that are arranged in series on a downstream side of the screen printing apparatus and perform a component mounting-relevant operation on the substrate on which the paste has been printed by the screen printing apparatus, wherein the screen printing apparatus includes a mask in which a first pattern-forming area in which a first pattern corresponding to a first type substrate is formed and a second pattern-forming area in which a second pattern corresponding to a second type substrate is formed are arranged in a predetermined pattern arrangement direction, a substrate support unit moving mechanism that moves a substrate support unit supporting a substrate in the pattern arrangement direction below the mask and that selectively brings the substrate into contact with one of the first pattern-forming area and the second pattern-forming area, and a print head that prints the paste on the substrate selectively brought into contact with one of the first pattern-forming area and the second pattern-forming area by moving over the mask, wherein each of the plurality of component mounting apparatuses includes a first substrate carrying lane and a second substrate carrying lane which are arranged in the pattern arrangement direction, carries the first type substrate on which the first pattern has been printed in the first substrate carrying lane, performs a component mounting-relevant operation on the first type substrate, carries the second type substrate on which the second pattern has been printed in the second substrate carrying lane, and performs a component mounting-relevant operation on the second type substrate, and wherein the screen printing apparatus selects a type of the substrate to be carried in depending on whether a substrate is carried in the second component mounting apparatus downstream from the screen printing apparatus.

According to the embodiment of the invention, there is provided a component mounting method in a component mounting line including a screen printing apparatus that prints paste on a substrate and a plurality of component mounting apparatuses that are arranged in series on the downstream side of the screen printing apparatus and perform a component mounting-relevant operation on the substrate on which the paste has been printed by the screen printing apparatus, the screen printing apparatus including a mask in which a first pattern-forming area in which a first pattern corresponding to a first type substrate is formed and a second pattern-forming area in which a second pattern corresponding to a second type substrate is formed are arranged in a predetermined pattern arrangement direction, a substrate support unit moving mechanism that moves a substrate support unit supporting a substrate in the pattern arrangement direction below the mask and that selectively brings the substrate into contact with one of the first pattern-forming area and the second pattern-forming area, and a print head that prints the paste on the substrate selectively brought into contact with one of the first pattern-forming area and the second pattern-forming area by moving over the mask, each of the plurality of component mounting apparatuses including a first substrate carrying lane and a second substrate carrying lane which are arranged in the pattern arrangement direction, the component mounting method including: a first operation step in which the each component mounting apparatus carries in the first type substrate on which the first pattern has been printed using the first substrate carrying lane and performs a component mounting-relevant operation on the first type substrate; a second operation step in which the each component mounting apparatus carries in the second type substrate on which the second pattern has been printed using the second substrate carrying lane and performs a component mounting-relevant operation on the first type substrate; and a selection step in which the screen printing apparatus selects the type of a substrate to be carried in depending on whether a substrate is carried in the second component mounting apparatus downstream from the screen printing apparatus.

According to the embodiment, it is possible to prevent degradation in the productivity in one substrate carrying lane even when carrying of a substrate in the other substrate carrying lane is delayed.

BRIEF DESCRIPTION OF THE DRAWINGS

A general configuration that implements the various features of the invention will be described with reference to the drawings. The drawings and the associated descriptions are provided to illustrate embodiments of the invention and should not limit the scope of the invention.

DETAILED DESCRIPTION OF THE EMBODIMENTS

Figure 1:
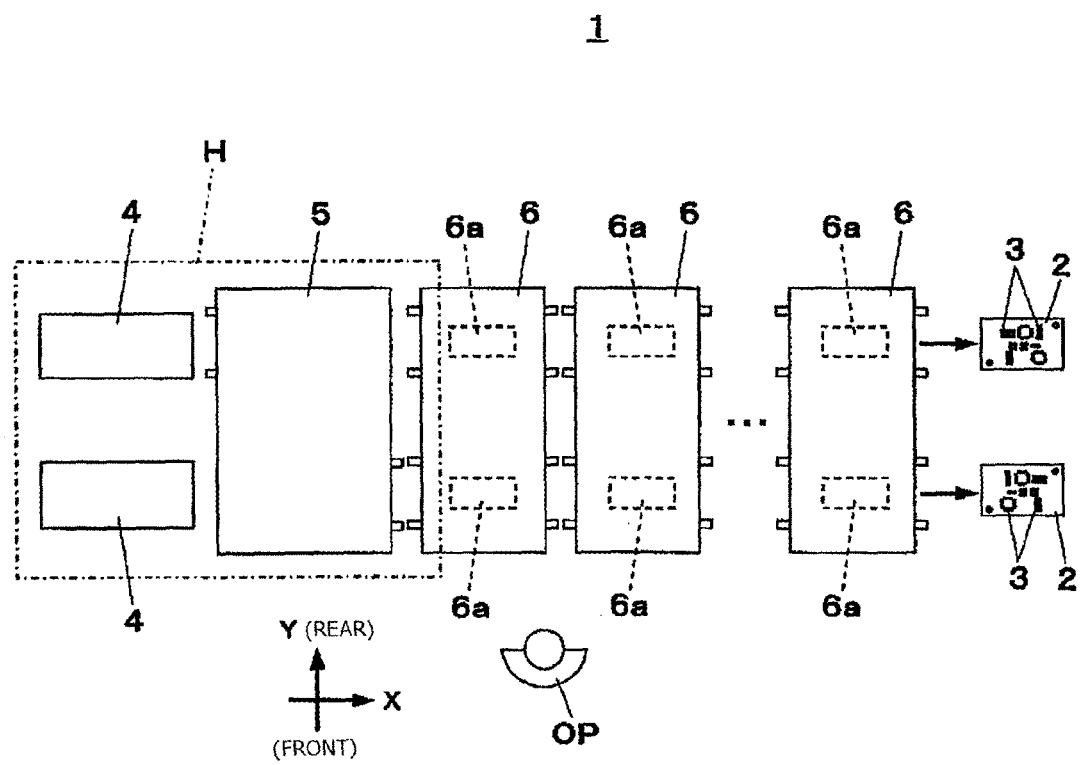
FIG. 1 is a plan view of a component mounting line according to an embodiment of the invention.
Figure 2:
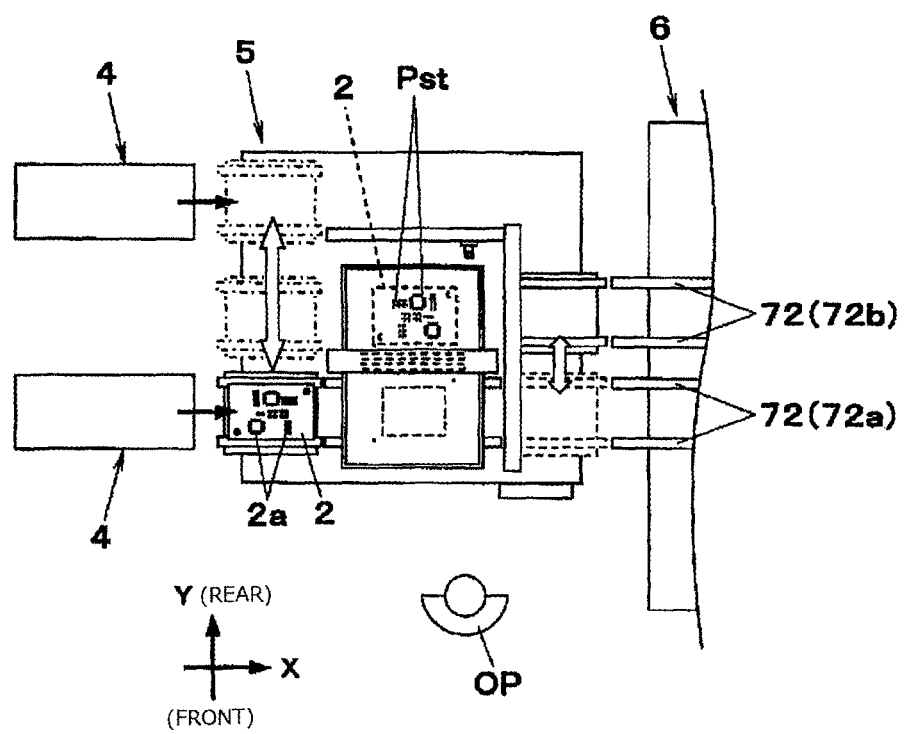
FIG. 2 is a plan view of a part of the component mounting line according to the embodiment of the invention.

Hereinafter, an embodiment of the invention will be described with reference to the accompanying drawings. FIG. 1 illustrates a component mounting line 1 according to the embodiment of the invention, and FIG. 2 illustrates a part (area H in FIG. 1) of the component mounting line 1. The component mounting line 1 is used to mount components 3 on substrates 2 to manufacture component-mounted substrates and includes a screen printing apparatus 5 printing paste Pst such as solder on an electrode 2a of the substrate 2 supplied from a substrate supply apparatus 4 and plural component mounting apparatuses 6 arranged in series on the downstream side of the screen printing apparatus 5. Here, the component mounting apparatus 6 is an apparatus that performs a component mounting-relevant operation on the substrate 2 on which the paste Pst has been printed by the screen printing apparatus 5, and examples thereof include an inspection apparatus that is installed on the downstream side of the screen printing apparatus 5 so as to inspect the substrate 2 subjected to the screen printing by the screen printing apparatus 5 and a component mounting apparatus is installed on the downstream side of the screen printing apparatus 5 or on the downstream side of the inspection apparatus so as to mount components 3 on the substrate 2 on which paste Pst has been printed by the screen printing apparatus 5.

In this embodiment, a flow direction of the substrate 2 in the component mounting line 1 is an in-plane direction (the right-left direction when viewed from an operator OP) of a horizontal plane directed from the left side of FIG. 1 to the right side and is defined as an X axis direction. An in-plane direction (the frontward-rearward direction when viewed from the operator OP) of the horizontal plane perpendicular to the X axis direction is defined as a Y axis direction, and the vertical direction is defined as a Z axis direction. In this embodiment, the left side of FIG. 1 corresponds to the upstream side (upstream step side) of the flow of the substrate 2 and the right side of FIG. 1 corresponds to the downstream side (downstream step side) of the flow of the substrate 2.

Figure 3:
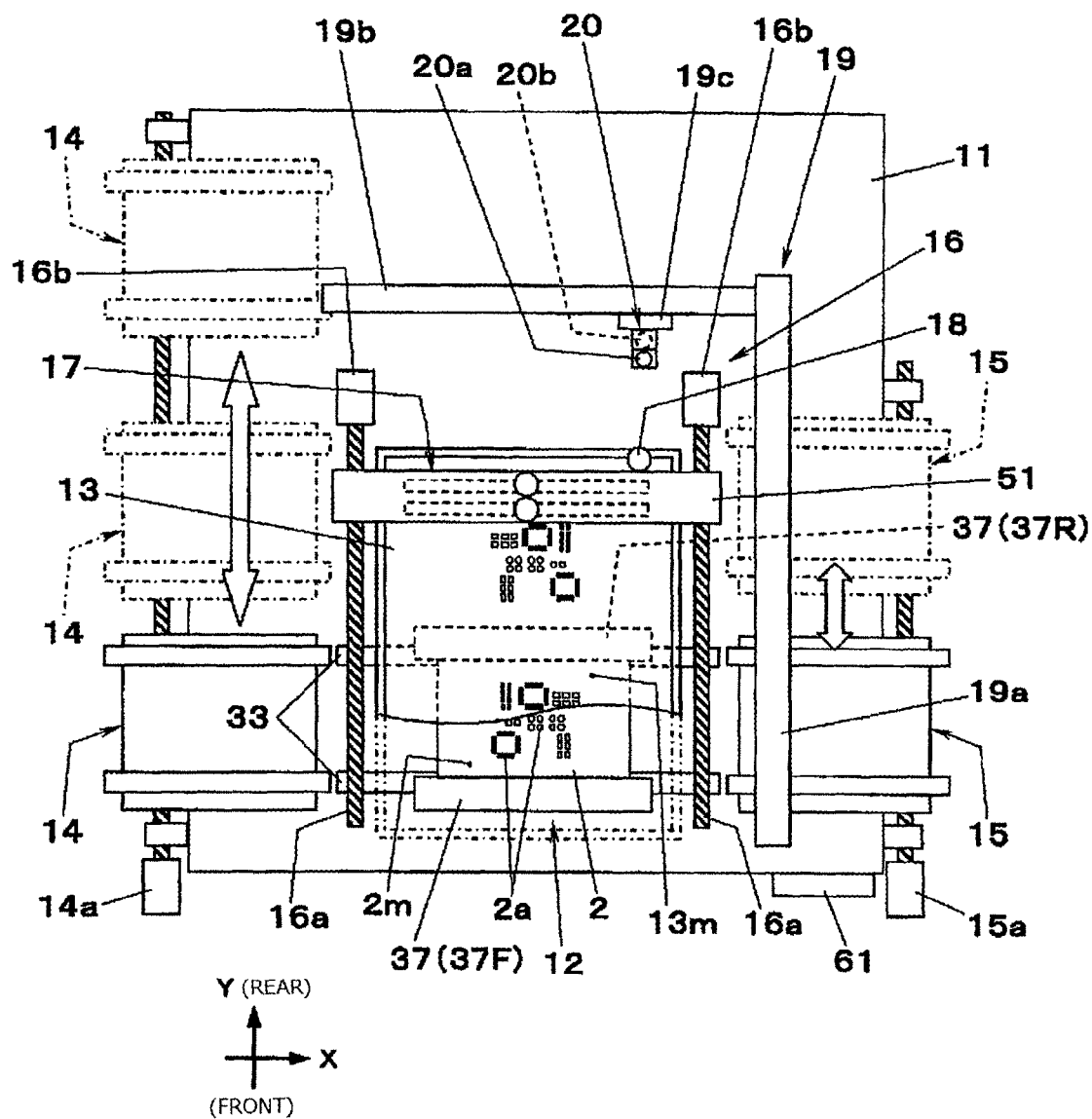
FIG. 3 is a plan view of a screen printing apparatus of the component mounting line according to the embodiment of the invention.
Figure 4:
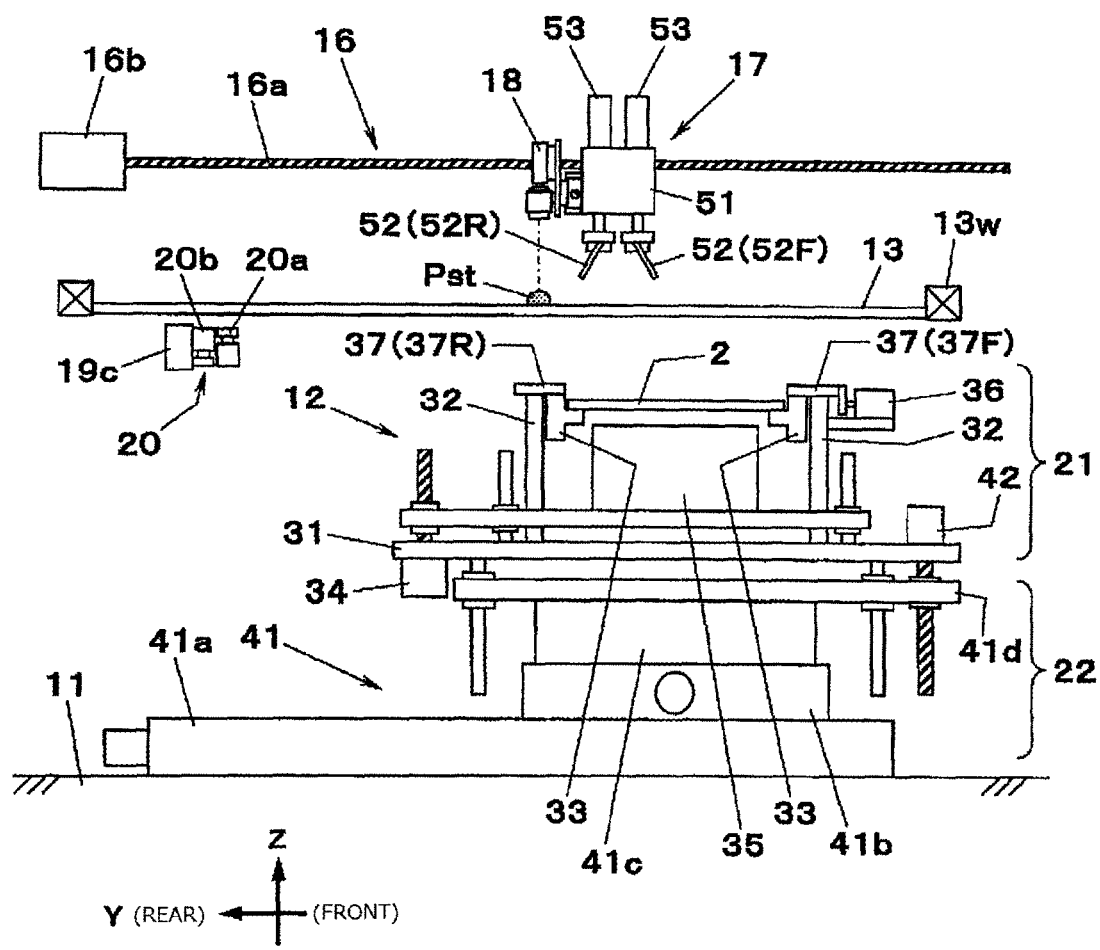
FIG. 4 is a lateral view of the screen printing apparatus according to the embodiment of the invention.

In FIGS. 3 and 4, the screen printing apparatus 5 includes a substrate holding and moving mechanism 12 on a base 11, and a mask 13 in which patterns (a first pattern PT1 and a second pattern PT2 illustrated in FIG. 5) to be printed on the substrate 2 are formed above the substrate holding and moving mechanism 12. A carrying-in conveyer 14 as a substrate carrying-in unit delivering a substrate 2 carried in from another apparatus (herein, the substrate supply apparatus 4) on the upstream process side to the substrate holding and moving mechanism 12 and a carrying-out conveyer 15 as a substrate carrying-out unit carrying out the substrate 2 sent out from the substrate holding and moving mechanism 12 to the component mounting apparatus 6 on the downstream process side are disposed on the upstream side (the left side in FIG. 1) in the flow of the substrate 2 of the substrate holding and moving mechanism 12 on the base 11. The screen printing apparatus 5 includes a print head 17 moved by a print head moving mechanism 16 and a paste supply mechanism 18 integrated with the print head 17 above the mask 13, and includes a camera unit 20 moved in the horizontal plane by a camera unit moving mechanism 19 below the mask 13.

In FIG. 4, the substrate holding and moving mechanism 12 of the screen printing apparatus 5 includes a substrate support unit 21 supporting a substrate 2 and a substrate support unit moving mechanism 22 moving the substrate support unit 21. The substrate support unit 21 includes a lifting plate 31 serving as a base, a pair of conveyers 33 (see FIG. 3) attached to a conveyer support member 32 extending upward from the lifting plate 31, a lower holding member 35 being lifted up and down above the lifting plate 31 by a first lifting motor 34 attached to the lifting plate 31, and a pair of clampers 37 (see FIG. 3) that are disposed above the conveyers 33 and that are opened and closed in the Y axis direction by a clamper driving motor 36. The conveyer 33 carries the substrate 2 received from the carrying-in conveyer 14 in the X axis direction and positions the substrate as a predetermined clamping position, and the lower holding member 35 supports the substrate 2 positioned at the clamping position from the bottom side. The clampers 37 clamp the side surface (the side surfaces facing each other in the Y axis direction) of the substrate 2 supported by the lower holding member 35 from the Y axis direction. Out of two clampers 37 arranged in the Y axis direction, the clamper located on the side (the right side of FIG. 4 which is defined as the front side) of the operator OP is referred to as a front clamper 37F, and the clamper located on the opposite side (the left side of FIG. 4 which is defined as the rear side) of the operator OP is referred to as a rear clamper 37R.

In FIG. 4, the substrate support unit moving mechanism 22 includes an XYθ table 41 that moves a base table 41d in the horizontal plane by relative movement of a Y table 41a, an X table 41b, and a θ table 41c which are stacked on the base 11 and a second lifting motor 42 that lifts the lifting plate 31 (that is, the entire substrate support unit 21) relative to the base table 41d. The substrate support unit moving mechanism 22 moves the substrate support unit 21 holding the substrate 2 (clamping the substrate with the clampers 37) through the use of the XYθ table 41 and lifts the substrate 2 through the use of the second lifting motor 42.

Figure 5:
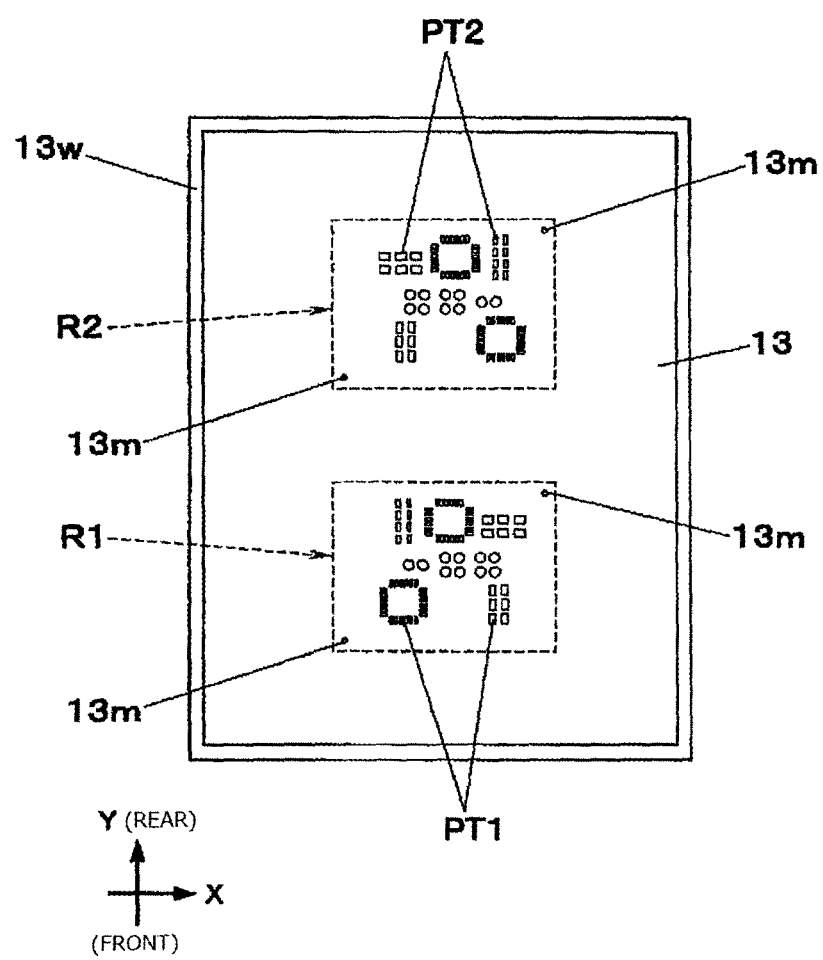
FIG. 5 is a plan view of a mask of the screen printing apparatus according to the embodiment of the invention.

In FIG. 5, the mask 13 has a rectangular panel shape extending in the XY plane and the outer circumference thereof is supported by a frame member 13w. In the mask 13, a first pattern-forming area R1 in which a first pattern PT1 corresponding to a first type substrate 2 is formed and a second pattern-forming area R2 in which a second pattern PT2 corresponding to a second type substrate 2 (for example, the substrate 2 obtained by reversing the first type substrate 2) is formed are arranged in the Y axis direction (in a predetermined direction in the horizontal plane) so as to perform screen printing operations corresponding to two types of substrates 2 of the first type substrate 2 and the second type substrate 2 (see FIGS. 6A and 6B).

In FIG. 3, the carrying-in conveyer 14 is movable in the Y axis direction (the arrangement direction of the first pattern-forming area R1 and the second pattern-forming area R2 of the mask 13) through the use of a carrying-in conveyer moving mechanism 14a. In FIG. 2, two substrate supply apparatuses 4 disposed on the upstream process side of the screen printing apparatus 5 are arranged in the Y axis direction, the carrying-in conveyer 14 can receive a substrate 2 from any of the two substrate supply apparatuses 4 by moving in the Y axis direction through the use of the carrying-in conveyer moving mechanism 14a and can deliver the substrate 2 to either the substrate support unit 21 located below the first pattern-forming area R1 or the substrate support unit 21 located below the second pattern-forming area R2. In FIG. 3, the carrying-out conveyer 15 is movable in the Y axis direction through the use of a carrying-out conveyer moving mechanism 15a and can receive a substrate 2 from either the substrate support unit 21 located in the first pattern-forming area R1 and the substrate support unit 21 located in the second pattern-forming area R2.

Figure 6A:
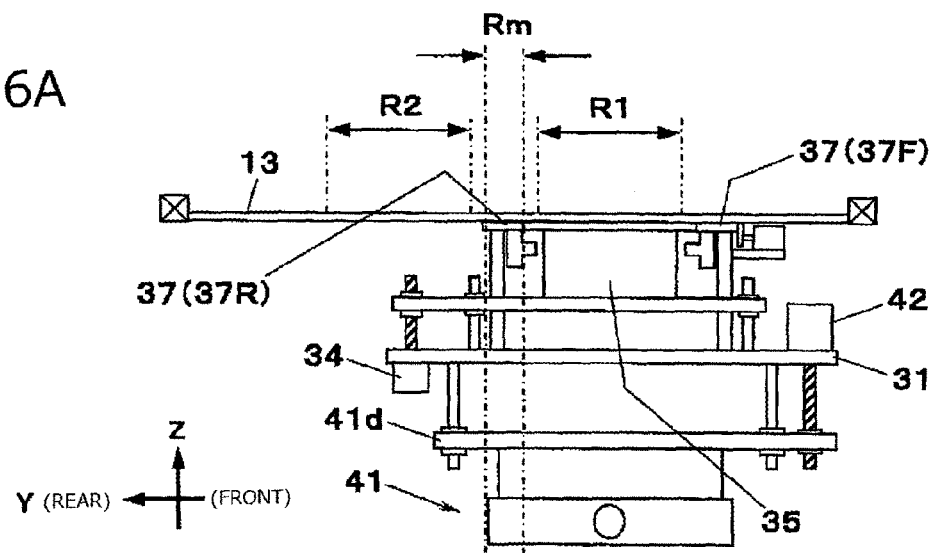
FIGS. 6A and 6B are partial lateral views of the screen printing apparatus according to the embodiment of the invention.
Figure 6B:
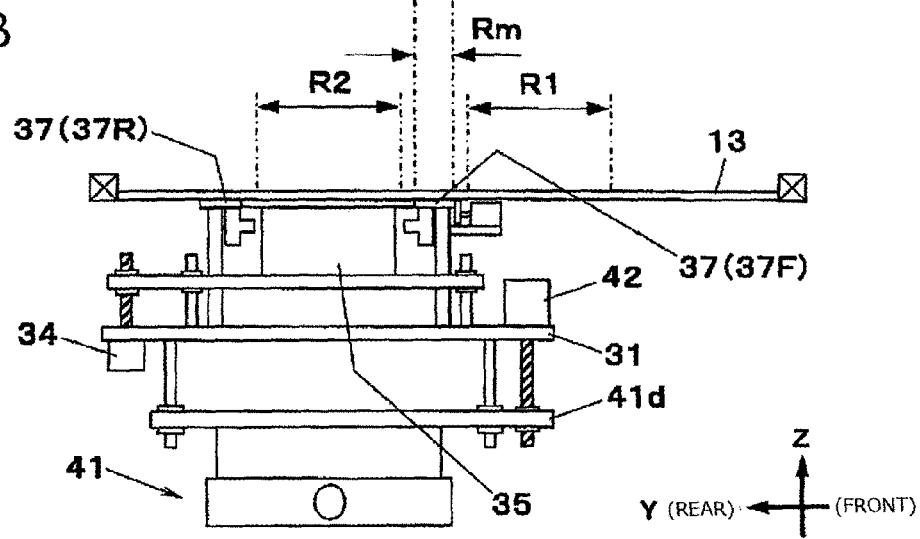

In FIG. 3, a set of two substrate-side marks 2m is disposed at diagonal positions of the substrate 2 (only one substrate-side mark 2m is illustrated in FIG. 3), and a set of two mask-side marks 13m corresponding to the substrate-side marks 2m are disposed in the first pattern-forming area R1 and the second pattern-forming area R2 on the mask 13 (see FIG. 5). When the substrate support unit 21 is lifted up by the second lifting motor 42 and the substrate 2 held by the substrate support unit 21 is brought into contact with the mask 13 in a state in which the two substrate-side marks 2m are matched with the two mask-side marks 13m disposed in the first pattern-forming area R1 in a plan view, the electrode 2a of the substrate 2 and the first pattern PT1 of the mask 13 are matched with each other (FIG. 6A). Similarly, when the substrate support unit 21 is lifted up by the second lifting motor 42 and the substrate 2 held by the substrate support unit 21 is brought into contact with the mask 13 in a state in which the two substrate-side marks 2m are matched with the two mask-side marks 13m disposed in the second pattern-forming area R2 in a plan view, the electrode 2a of the substrate 2 and the second pattern PT2 of the mask 13 are matched with each other (FIG. 6B). In this way, in this embodiment, the substrate holding and moving mechanism 12 moves the substrate support unit 21 holding the substrate 2 in the pattern arrangement direction (in the Y axis direction) below the mask 13 so as to selectively bring the substrate 2 in contact with one of the first pattern-forming area R1 and the second pattern-forming area R2.

As illustrated in FIGS. 6A and 6B, in this embodiment, an area on the mask 13 coming in contact with the rear clamper 37R when the substrate 2 is brought into contact with the first pattern-forming area R1 of the mask 13 and an area on the mask 13 coming in contact with the front clamper 37F when the substrate 2 is brought into contact with the second pattern-forming area R2 of the mask 13 are the same area Rm between the first pattern-forming area R1 and the second pattern-forming area R2. Accordingly, even when the substrate is brought into contact with any one of the first pattern-forming area R1 and the second pattern-forming area R2, the clamper 37 (one of the front clamper 37F and the rear clamper 37R) is located in the area Rm between the first pattern-forming area R1 and the second pattern-forming area R2.

In FIGS. 3 and 4, the print head 17 includes two squeegees 52 arranged to face each other in the Y axis direction below a movable base 51 extending in the X axis direction. The print head moving mechanism 16 includes two print head moving ball screws 16a extending in the Y axis direction to be screwed through the right and left ends of the movable base 51 and two print head moving motors 16b rotationally driving the two print head moving ball screws 16a. When the two print head moving ball screws 16a synchronously rotates through the use of the two print head moving motors 16b, the movable base 51 moves in the Y axis direction. The two squeegees 52 are individually lifted up and down below the movable base 51 by squeegee lifting cylinders 53 disposed in the movable base 51. Out of the two squeegees 52 arranged in the Y axis direction, the squeegee located on the side of the operator OP (the right side of FIG. 4) is referred to as a front squeegee 52F, and the squeegee located on the opposite side of the operator OP (the left side of FIG. 4) is referred to as a rear squeegee 52R.

In FIGS. 3 and 4, the camera unit 20 includes an upper imaging camera 20a of which the imaging field of vision faces the upper side and a lower imaging camera 20b of which the imaging field of vision faces the lower side. The camera unit moving mechanism 19 moving the camera unit 20 in the in-plane direction of the horizontal plane includes a Y axis table 19a extending in the Y axis direction on the base 11, an X axis table 19b extending in the X axis direction and moving over the Y axis table 19a, and a movable plate 19c moving over the X axis table 19b. The camera unit 20 is attached to the movable plate 19c and moves in the horizontal plane by the movement of the X axis table 19b in the Y axis direction relative to the Y axis table 19a and the movement of the movable plate 19c in the X axis direction relative to the X axis table 19b.

The paste supply mechanism 18 stores paste Pst therein and ejects the paste to the lower side. In FIGS. 3 and 4, the paste supply mechanism 18 is attached to the movable base 51, moves in the Y axis direction along with the squeegees 52 by the movement of the movable base 51 in the Y axis direction, and moves in the X axis direction over the movable base 51. Accordingly, the paste supply mechanism 18 can freely move in the horizontal plane by the movement of the movable base 51 in the Y axis direction and the movement of the paste supply mechanism 18 in the X axis direction and can supply the paste Pst to any area on the mask 13. The paste supply mechanism 18 supplies the paste Pst to the area Rm between the first pattern-forming area R1 and the second pattern-forming area R2 in a shape extending in the extending direction of the squeegees 52 (that is, the X axis direction).

Figure 7:
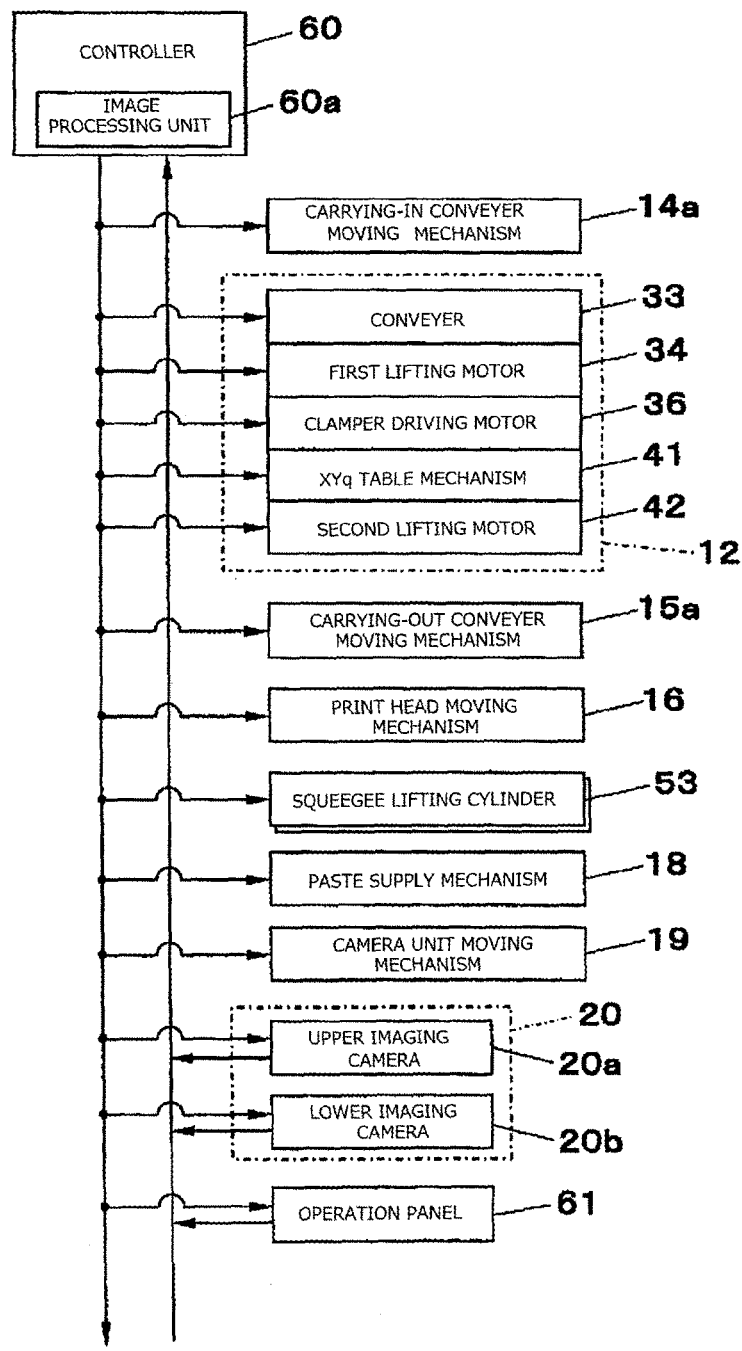
FIG. 7 is a block diagram illustrating a control system of the screen printing apparatus according to the embodiment of the invention.

In FIG. 7, the moving operation of the carrying-in conveyer 14 in the Y axis direction by the carrying-in conveyor moving mechanism 14a, the carrying-in operation of the substrate 2 by the carrying-in conveyer 14, the moving operation of the substrate 2 to the clamping position by the conveyers 33, the lifting operation of the lower holding member 35 by the first lifting motor 34, the clamping operation of the clampers 37 by the clamper driving motor 36, the moving operation of the substrate support unit 21 in the horizontal plane by the XYθ table 41, the lifting operation of the substrate support unit 21 by the second lifting motor 42, the moving operation of the carrying-out conveyor 15 in the Y axis direction by the carrying-out conveyer moving mechanism 15a, and the carrying-out operation of the substrate 2 by the carrying-out conveyer 15 are controlled by the controller 60 of the screen printing apparatus 5. The moving operation of the print head 17 in the Y axis direction by the print head moving mechanism 16, the lifting operations of the squeegees 52 by the squeegee lifting cylinders 53, the ejecting operation of the paste Pst by the paste supply mechanism 18, and the moving operation of the camera unit 20 in the horizontal plane by the camera unit moving mechanism 19 are also controlled by the controller 60.

In FIG. 7, the upper imaging camera 20a is controlled by the controller 60 and performs imaging of the mask-side marks 13m disposed in the first pattern-forming area R1 of the mask 13 and imaging of the mask-side marks 13m disposed in the second pattern-forming area R2 of the mask 13. The lower imaging camera 20b is controlled by the controller 60 and images the substrate-side marks 2m on the substrate 2 held by the substrate support unit 21. Image data obtained by the imaging of the upper imaging camera 20a and image data obtained by imaging of the lower imaging camera 20b are input to the controller 60 and are processed by an image processing unit 60a of the controller 60. The controller 60 calculates the positions of the mask-side marks 13m and the positions of the substrate-side marks 2m on the basis of the obtained image of the mask-side marks 13m and the obtained images of the substrate-side marks 2m (imaging results).

In FIG. 3, an operation panel 61 with a display device installed thereon which is operated by the operator OP is disposed on the front side (the side of the operator OP) of the base 11. The operation panel 61 is connected to the controller 60 (FIG. 7), and the operator OP can input operations of the screen printing apparatus 5 through the operation panel 61 and can acquire a variety of information on the screen printing apparatus 5.

A flow of the screen printing operation using the screen printing apparatus 5 will be described below with reference to FIGS. 8A to 11B. When a substrate 2 is sent out from one of two substrate supply apparatuses 4, the controller 60 activates the carrying-in conveyer moving mechanism 14a to move the carrying-in conveyer 14 to a position facing the substrate supply apparatus 4 to send out the substrate 2. Then, the controller 60 causes the carrying-in conveyer 14 to receive the substrate 2 sent out from the substrate supply apparatus 4 and activates the XYθ table 41 to move the substrate support unit 21 to a position (referred to as a first position) below the first pattern-forming area R1 or a position (referred to as a second position) below the second pattern-forming area R2. Here, which of the first position and the second position to move the substrate support unit 21 to is determined by the type (the arrangement of the electrode 2a) of the substrate 2 received by the carrying-in conveyer 14. The substrate support unit 21 is located at the first position when the arrangement of the electrode 2a of the substrate 2 corresponds to the first pattern PT1, and the substrate support unit 21 is located at the second position when the arrangement of the electrode 2a of the substrate 2 corresponds to the second pattern PT2.

When the substrate support unit 21 is located at the first position or the second position, the controller 60 moves the carrying-in conveyer 14 having received the substrate 2 from the substrate supply apparatus 4 to a position facing the first position or a position facing the second position. Here, the controller 60 locates the carrying-in conveyer 14 at the position facing the first position when the substrate support unit 21 is located at the first position, and locates the carrying-in conveyer 14 at the position facing the second position when the substrate support unit 21 is located at the second position.

When the carrying-in conveyer 14 is located at the position facing the first position or at the position facing the second position, the controller 60 activates the carrying-in conveyer 14 and the conveyer 33 of the substrate support unit 21 in cooperation with each other, carries the substrate 2 in the substrate support unit 21, and positions the substrate 2 at the clamping position. Then, when the first lifting motor 34 is activated to lift the lower holding member 35 up and to support the substrate 2 from the lower side and the substrate 2 is lifted up from the conveyer 33 (arrow A1 in FIG. 8A), the clamper driving motor 36 is activated to clamp and hold the substrate 2 with the clampers 37 (arrow B1 in FIG. 8A).

When the substrate 2 is held by the substrate support unit 21 as described above, the controller 60 moves the camera unit 20 through the use of the camera unit moving mechanism 19 and images the mask-side marks 13m through the use of the upper imaging camera 20a. The imaging of the mask-side marks 13m is performed on the mask-side marks 13m in the first pattern-forming area R1 when the substrate 2 will be brought into contact with the first pattern-forming area R1, and is performed on the mask-side marks 13m in the second pattern-forming area R2 when the substrate 2 i brought into contact with the second pattern-forming area R2. After the mask-side marks 13m are imaged, the controller 60 images the substrate-side marks 2m through the use of the lower imaging camera 20b.

Figure 8A:
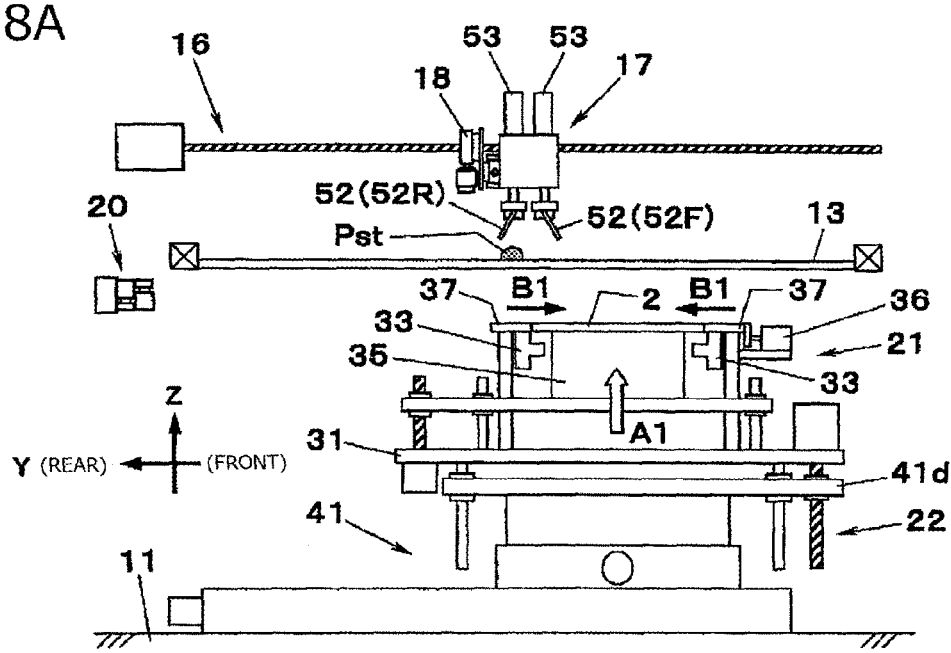
FIGS. 8A and 8B are diagrams illustrating operations of the screen printing apparatus according to the embodiment of the invention.
Figure 8B:
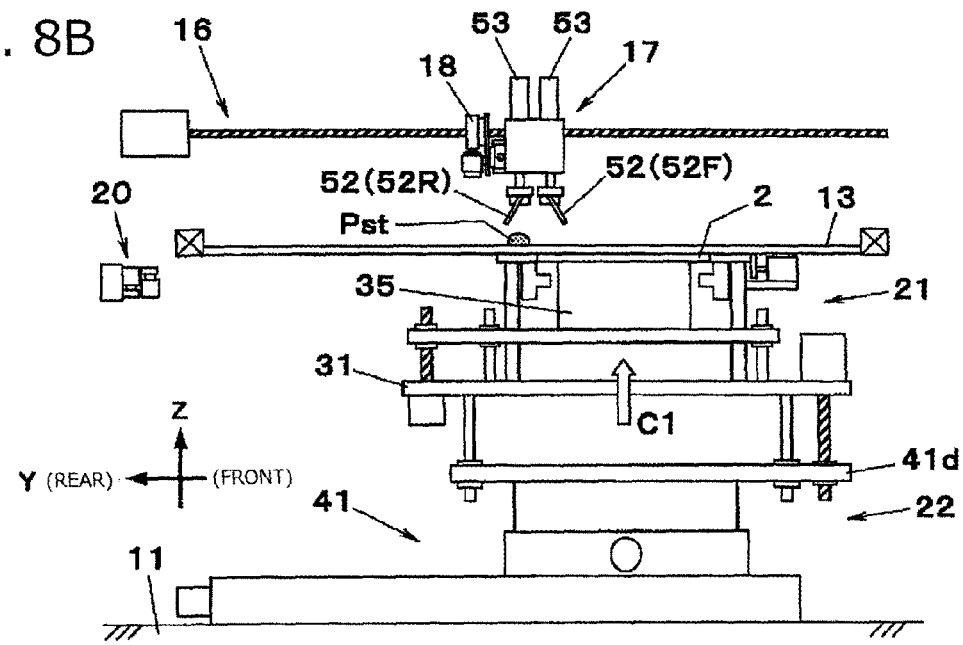
Figure 9A:
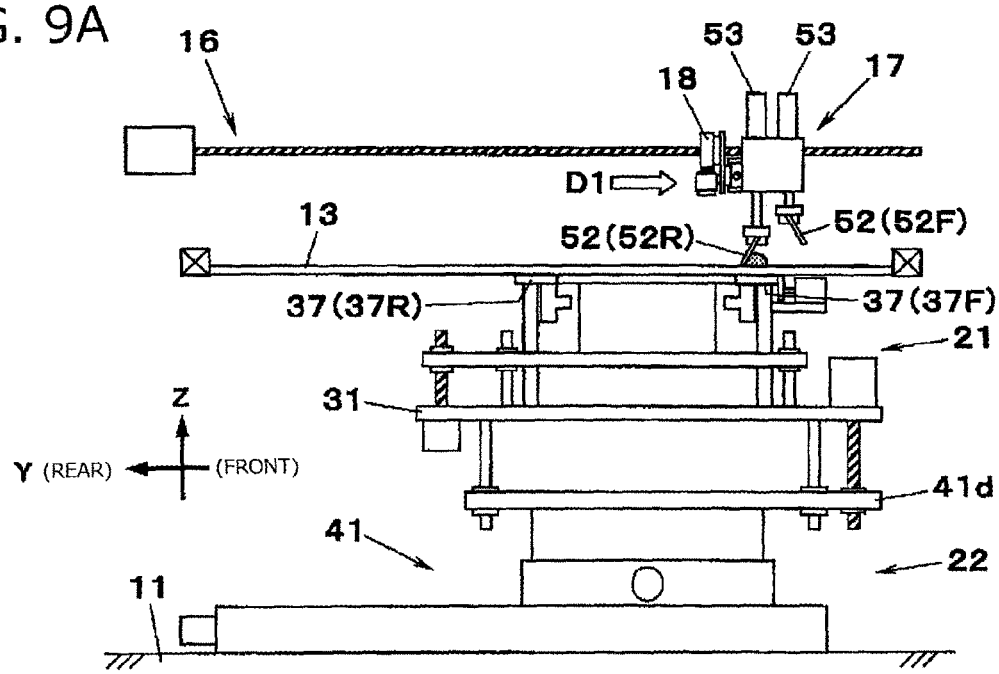
FIGS. 9A and 9B are diagrams illustrating operations of the screen printing apparatus according to the embodiment of the invention.
Figure 9B:
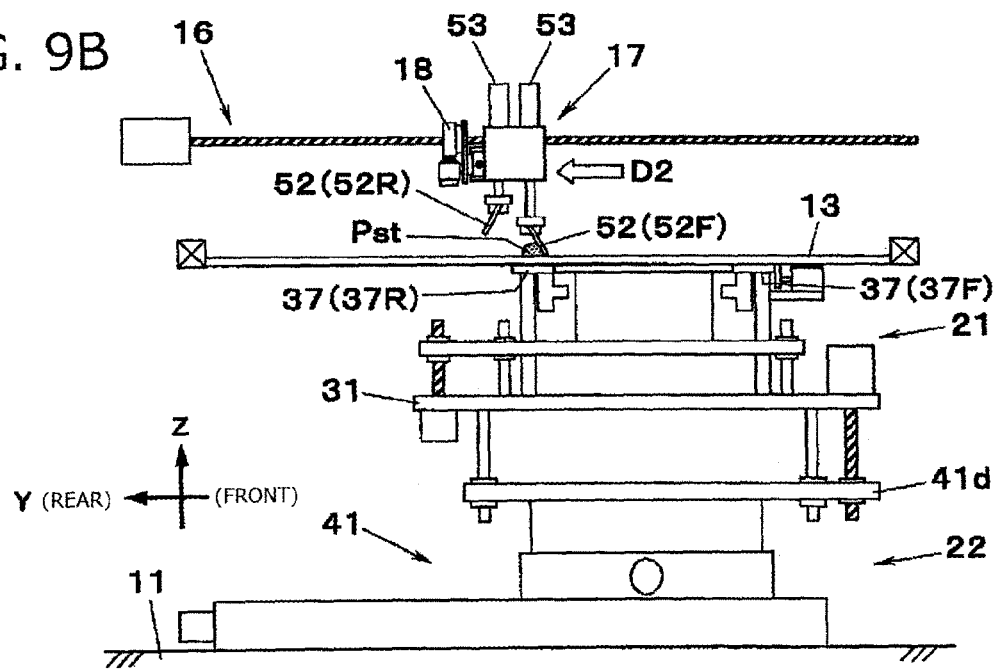
Figure 10A:
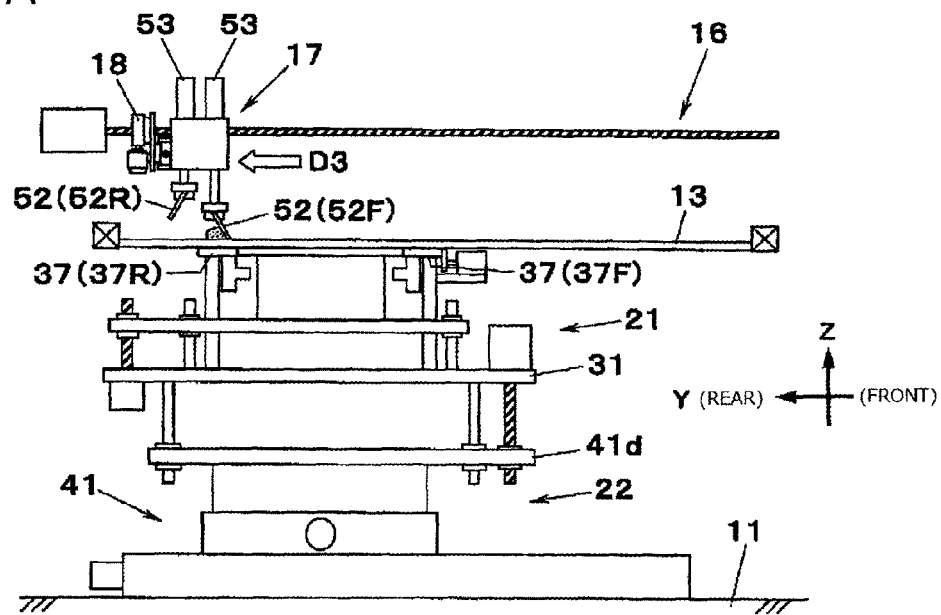
FIGS. 10A and 10B are diagrams illustrating operations of the screen printing apparatus according to the embodiment of the invention.
Figure 10B:
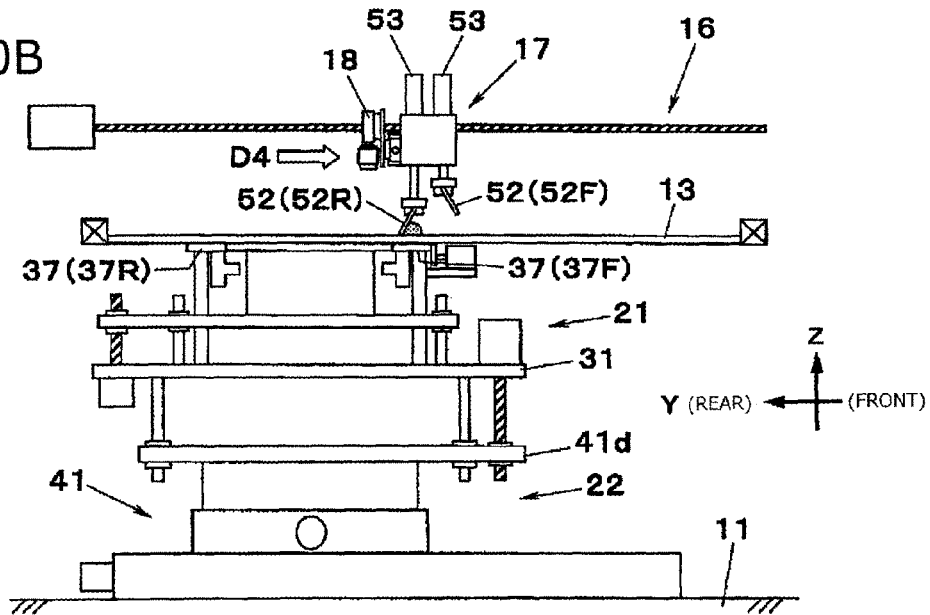

After the mask-side marks 13m and the substrate-side marks 2m are imaged, the controller 60 activates the substrate holding and moving mechanism 12 to bring the substrate 2 into contact with the mask 13 in the same way as described above (arrow C1 in FIG. 8B). Accordingly, the electrode 2a of the substrate 2 is matched with the pattern (the first pattern PT1 or the second pattern PT2) of the mask 13 (FIG. 8B).

After the substrate 2 is brought into contact with the mask 13, the controller 60 causes a paste volume checking apparatus (not illustrated) to check whether a sufficient amount of paste Pst is present in the area Rm (on the mask 13 coming in contact with the front clamper 37F or the rear clamper 37R) between the first pattern-forming area R1 and the second pattern-forming area R2. When it is determined that a sufficient amount of paste Pst is not present, the controller 60 causes the paste supply mechanism 18 to supply the paste Pst to the area Rm.

When it is determined that a sufficient amount of paste Pst is present in the area Rm between the first pattern-forming area R1 and the second pattern-forming area R2 as the result of the paste volume checking (the paste volume checking performed thereafter when the paste Pst is supplied by the paste supply mechanism 18), the controller 60 performs squeegeeing of the paste Pst using the squeegees 52. In the squeegeeing, the controller 60 moves the movable base 51 in the Y axis direction and causes the print head 17 to reciprocate (slide) over the first pattern-forming area R1 or over the second pattern-forming area R2. By this squeegeeing, the paste Pst is scraped on the mask 13 to fill the pattern of the mask 13, and the paste Pst is printed on the substrate 2.

In the squeegeeing, when the printing using the first pattern PT1 is performed on the substrate 2, first, the rear squeegee 52R is lifted down from above the area Rm between the first pattern-forming area R1 and the second pattern-forming area R2 so as to bring the bottom thereof into contact with the rear Rm (the mask 13 coming in contact with the rear clamper 37R). With the contact position (a position in the area Rm between the first pattern-forming area R1 and the second pattern-forming area R2 on the mask 13) as a movement start position, the rear squeegee 52R is moved forward (arrow D1 in FIG. 9A). When the rear squeegee 52R slides over the first pattern-forming area R1 on the mask 13 and reaches above the front clamper 37F, the rear squeegee 52R is lifted up and the front squeegee 52F is lifted down to come in contact with the front clamper 37F. The front squeegee 52F is moved backward from the contact position (arrow D2 in FIG. 9B), and when the front squeegee 52F slides over the first pattern-forming area R1 on the mask 13 and is returned to the movement start position on the rear clamper 37R, the front squeegee 52F is lifted up and to be on standby.

On the other hand, when the printing using the second pattern PT2 is performed on the substrate 2, first, the front squeegee 52F is lifted down from above the area Rm between the first pattern-forming area R1 and the second pattern-forming area R2 so as to bring the bottom thereof into contact with the area Rm (the mask 13 coming in contact with the front clamper 37F). With the contact position as a movement start position, the front squeegee 52F is moved backward (arrow D3 in FIG. 10A). When the front squeegee 52F slides over the second pattern-forming area R2 on the mask 13 and reaches above the rear clamper 37R, the front squeegee 52F is lifted up and the rear squeegee 52R is lifted down to come in contact with the rear clamper 37R. The rear squeegee 52R is moved forward from the contact position (arrow D4 in FIG. 10B), and when the rear squeegee 52R slides over the second pattern-forming area R2 on the mask 13 and is returned to the movement start position on the front clamper 37F, the rear squeegee 52R is lifted up to be on standby.

In this way, in the screen printing apparatus 5 according to this embodiment, the print head 17 prints the paste Pst on the substrate 2 selectively brought into contact with one of the first pattern-forming area R1 and the second pattern-forming area R2 by moving over the mask 13. At this time, the print head 17 sets a position in the area Rm between the first pattern-forming area R1 and the second pattern-forming area R2 on the mask 13 as the movement start position and is operated to reciprocate in the Y axis direction over the first pattern-forming area R1 from the movement start position and is returned to the movement start position when the first pattern PT1 is printed on the substrate 2 coming in contact with the first pattern-forming area R1 and to reciprocate in the Y axis direction over the second pattern-forming area R2 from the movement start position and is returned to the movement start position when the second pattern PT2 is printed on the substrate 2 coming in contact with the second pattern-forming area R2.

Figure 11A:
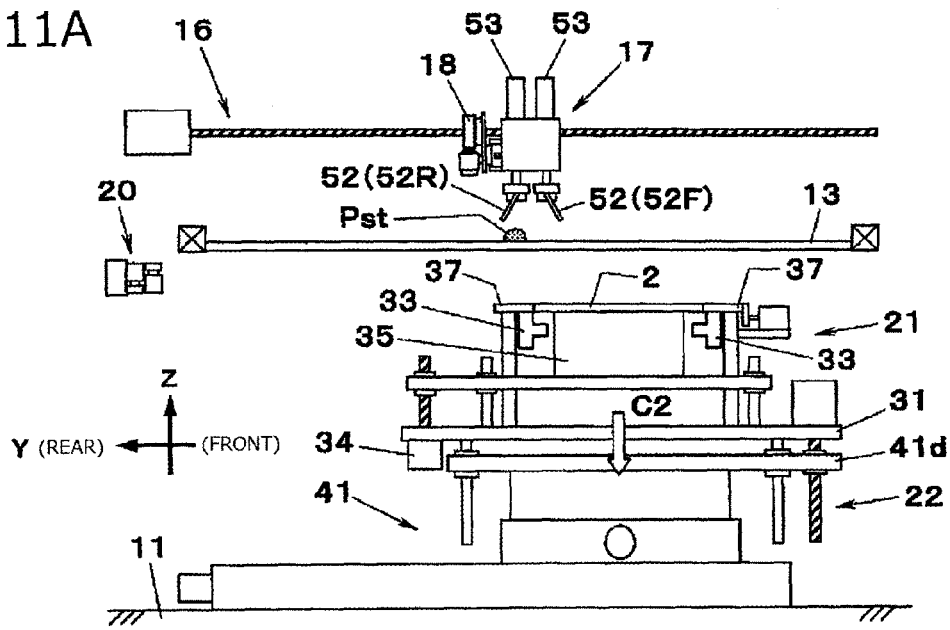
FIGS. 11A and 11B are diagrams illustrating operations of the screen printing apparatus according to the embodiment of the invention.

When the squeegees 52 reciprocates to fill the pattern of the mask 13 with the paste Pst and to print the paste Pst on the substrate 2, the controller 60 activates the second lifting motor 42 to lift down the lifting plate 31 (arrow C2 in FIG. 11A) and separates the substrate 2 from the mask 13 to perform substrate separation (FIG. 11A). Accordingly, the screen printing operation for each substrate 2 ends.

Figure 11B:
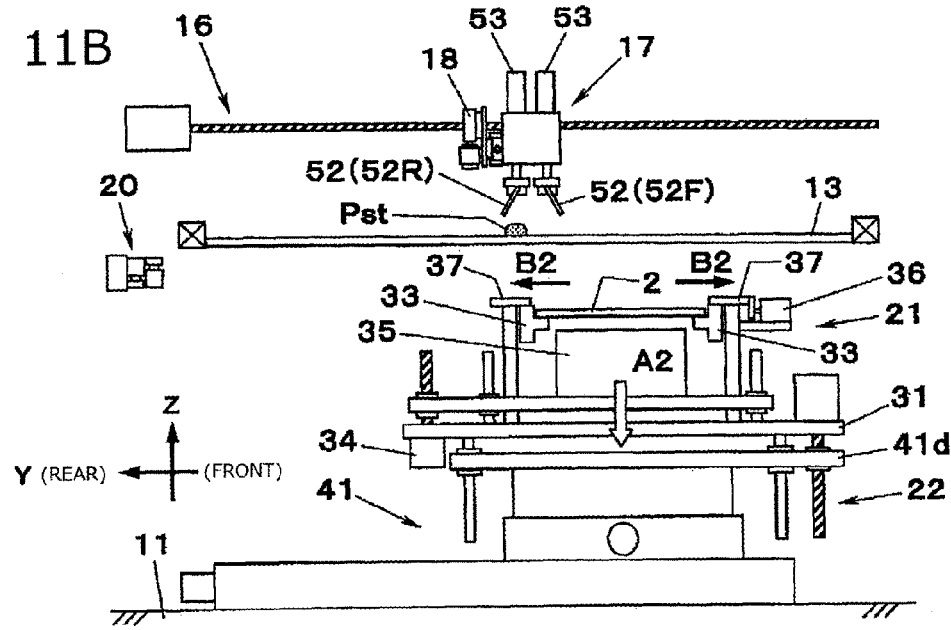

When the screen printing operation for each substrate 2 ends, the controller 60 opens the clampers 37 (arrow B2 in FIG. 11B), lifts down the lower holding member 35 (arrow A2 in FIG. 11B), and places the substrate 2 on the conveyer 33 (FIG. 11B). Then, the conveyer 33 and the carrying-out conveyer 15 are activated in cooperation with each other to carry out the substrate 2 to the first component mounting apparatus 6 downstream from the screen printing apparatus 5. After the substrate 2 is carried out, the controller 60 determines whether a substrate 2 not yet subjected to the screen printing is present. As a result, the substrate 2 is carried in by the carrying-in conveyer 14 when a substrate 2 not yet subjected to the screen printing is present, and the series of operations end when a substrate 2 not subjected to the screen printing is not present.

In the screen printing operation, the print head 17 reciprocates over the first pattern-forming area R1 or over the second pattern-forming area R2 from the movement start position in the area Rm between the first pattern-forming area R1 and the second pattern-forming area R2 on the mask 13 and prints the paste Pst on the substrate 2. Accordingly, for example, when the second pattern PT2 is printed on the second type substrate 2 after the first pattern PT1 is printed on the first type substrate 2 as well as when the first pattern PT1 is printed on the first type substrate 2 after the first pattern PT1 is printed on the first type substrate 2, the paste Pst is present at the movement start position which is the start position of reciprocation and it is thus possible to use the paste Pst on the mask 13 without any waste. Accordingly, it is possible to reduce the amount of paste Pst that is wasted. The paste Pst on the mask 13 is returned to the area Rm between the first pattern-forming area R1 and the second pattern-forming area R2 on the mask 13 after the printing. Accordingly, even when different types of substrates 2 are carried in randomly (that is, even when the substrate 2 is carried in any one of the first pattern-forming area R1 and the second pattern-forming area R2), the printing operation can be immediately started.

In FIGS. 1 and 2, each component mounting apparatus 6 includes two substrate carrying lanes 72 (the first substrate carrying lane 72a or the second substrate carrying lane 72b) arranged in the pattern arrangement direction (Y axis direction) on the mask 13 of the screen printing apparatus 5 and working devices 6a corresponding to details of the component mounting-relevant operations for the first type substrate 2 and the second type substrate 2.

The component mounting apparatus 6 carries and positions the substrate 2 received from the screen printing apparatus 5 through the use of the first substrate carrying lane 72a or the second substrate carrying lane 72b and performs a predetermined component mounting-relevant operation through the use of the working device 6a. For example, when the operation is an inspection operation of the substrate 2 on which the paste Pst has been printed by the screen printing apparatus 5, the working device 6a is an inspection head. When the operation is a component mounting operation of picking up a component 3 from a component supply unit and mounting the component 3 on the substrate 2, the working device 6a is a mounting head. When the predetermined component mounting-relevant operation is ended by the working device 6a, the component mounting apparatus 6 activates the substrate carrying lane 72 to carry out the substrate 2 to the downstream process side.

In this way, each component mounting apparatus 6 installed on the downstream side of the screen printing apparatus 5 includes the first substrate carrying lane 72a and the second substrate carrying lane 72b which are arranged in the arrangement direction (Y axis direction) of the patterns (the first pattern PT1 and the second pattern PT2) of the mask 13 in the screen printing apparatus 5, carries the first type substrate 2 on which the first pattern PT1 has been printed in the first substrate carrying lane 72a, performs the component mounting-relevant operation (first operation step) on the substrate 2, carries the second type substrate 2 on which the second pattern PT2 has been printed in the second substrate carrying lane 72b, and performs the component mounting-relevant operation (second operation step) on the substrate 2.

On the other hand, the screen printing apparatus 5 selects the type of a substrate 2 to be carried in depending on whether a substrate is carried in the second component mounting apparatus 6 (hereinafter, referred to as second component mounting apparatus 6) downstream from the screen printing apparatus 5. More specifically, the type of the substrate 2 carried in the substrate carrying lane 72 on the side requesting the substrate 2 out of two substrate carrying lanes 72 of the second component mounting apparatus 6 is set as the type of the substrate 2 to be carried in the screen printing apparatus 5 (selection process). When a substrate 2 is not present in two substrate carrying lanes 72 (the first substrate carrying lane 72a and the second substrate carrying lane 72b) thereof, each component mounting apparatus 6 outputs a signal for requesting carrying-out of a substrate 2 (substrate request signal) to the component mounting apparatus 6 on the immediate upstream side (the first component mounting apparatus 6 (hereinafter, referred to as first component mounting apparatus 6) downstream from the screen printing apparatus 5 outputs the substrate request signal to the screen printing apparatus 5). The component mounting apparatus 6 (or the screen printing apparatus 5) having received the substrate request signal in a state in which it can carry out the substrate 2 carries out the substrate 2 to the first component mounting apparatus 6 (that is, having output the substrate request signal).

In this embodiment, the second component mounting apparatus 6 outputs the substrate request signal to the screen printing apparatus 5 as well as the first component mounting apparatus 6. Then, the screen printing apparatus 5 determines the type of a substrate to be carried in from the substrate supply apparatus 4 on the basis of the substrate request signal output from the second component mounting apparatus 6.

Figure 12:
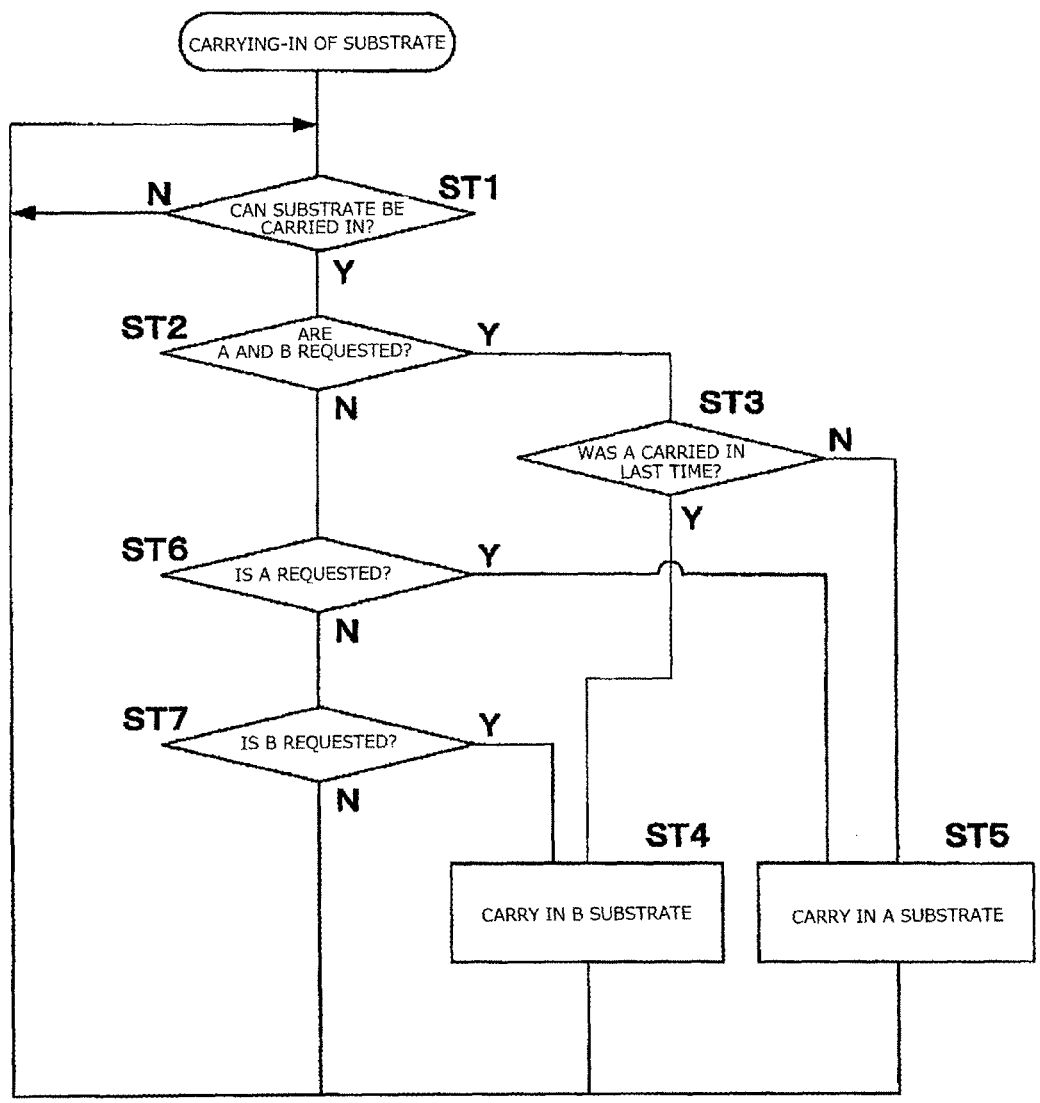
FIG. 12 is a flowchart illustrating a determination flow that is performed by a controller of the screen printing apparatus according to the embodiment of the invention.

FIG. 12 is a flowchart illustrating a determination flow that is performed by the controller 60 when the type of a substrate 2 to be carried in the screen printing apparatus 5. The controller 60 determines whether a substrate 2 can be received by the carrying-in conveyer 14, that is, whether a substrate 2 is present in the carrying-in conveyer 14 and the substrate support unit 21 (step ST1). When a substrate 2 cannot be received (when a substrate 2 is present in the carrying-in conveyer 14 or the substrate support unit 21), the controller waits until a substrate 2 can be received. When a substrate can be received, the controller 60 determines whether the substrate request signal output from the second component mounting apparatus 6 to the first component mounting apparatus 6 includes both substrate request signals of a substrate request signal (referred to as A substrate request signal) for requesting the first type substrate 2 (referred to as A substrate) and a substrate request signal (referred to as B substrate request signal) for requesting the second type substrate 2 (referred to as B substrate) (step ST2). When it is determined that both substrate request signals of the A substrate request signal and the B substrate request signal are received, the controller 60 determines whether the second component mounting apparatus 6 carries the A substrate in last time (step ST3). The B substrate is carried in (step ST4) when the second component mounting apparatus 6 carries the A substrate in last time, the A substrate is carried in (step ST5) when the second component mounting apparatus 6 carries the B substrate in.

On the other hand, when it is determined in step ST2 that both substrate request signals of the A substrate request signal and the B substrate request signal are not received from the second component mounting apparatus 6, the controller 60 determines whether the A substrate request signal is received (step ST6). The A substrate is carried in (step S5) when it is determined that the A substrate request signal is received, and it is determined whether the B substrate request signal is received otherwise (step ST7). The B substrate is carried in (step ST4) when it is determined that the B substrate request signal is received, and the process flow is returned to step ST1 otherwise.

The operation of the component mounting line 1 will be described below with reference to FIGS. 13 to 15 on the basis of the control of the controller 60. In FIGS. 13 to 15, the A substrate is referenced by reference sign "A", and the B substrate is referenced by reference sign "B". In FIGS. 13 to 15, a solid arrow represents a path through which a substrate 2 has passed and a dotted arrow represents a substrate request signal.

Figure 13A:
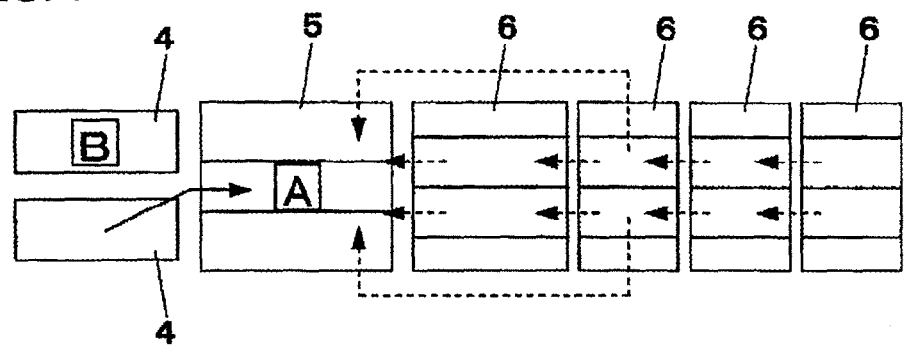
FIGS. 13A, 13B, and 13C are diagrams illustrating operations of the component mounting line according to the embodiment of the invention.
Figure 13B:
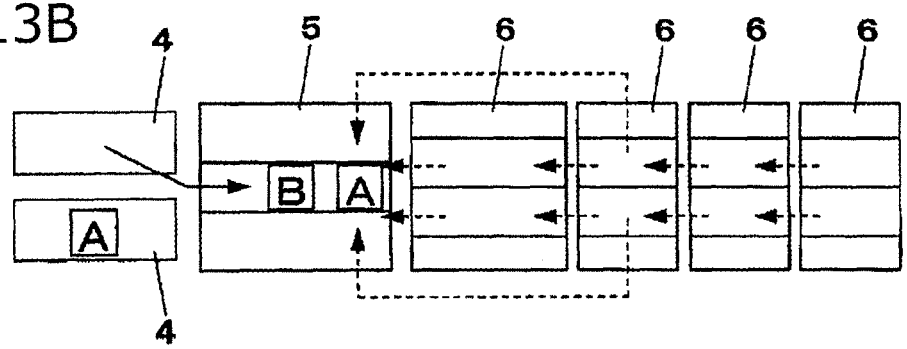

When the component mounting line 1 starts manufacturing, each component mounting apparatus 6 outputs a substrate request signal for an A substrate 2 and a substrate request signal for a B substrate 2 to the component mounting apparatus 6 on the immediate upstream side thereof (the first component mounting apparatus 6 outputs the substrate request signal to the screen printing apparatus 5). The second component mounting apparatus 6 outputs a substrate request signal to the screen printing apparatus 5 as well as the first component mounting apparatus 6. The screen printing apparatus 5 receives the A substrate from the substrate supply apparatus 4 through the use of the carrying-in conveyer 14 on the basis of the substrate request signal for the A substrate output from the second component mounting apparatus 6 to the screen printing apparatus 5 (when it is assumed that the A substrate is preferentially carried in at the time of start of manufacturing). The A substrate is carried in the substrate support unit 21 and is subjected to the screen printing (FIG. 13A). The screen printing apparatus 5 carries the A substrate subjected to the screen printing to the carrying-out conveyer 15 to be on standby, and receives the B substrate from the substrate supply apparatus 4 on the basis of the substrate request signal for the B substrate output from the second component mounting apparatus 6. The received B substrate is carried in the substrate support unit 21 and is subjected to the screen printing (FIG. 13B).

Figure 13C:
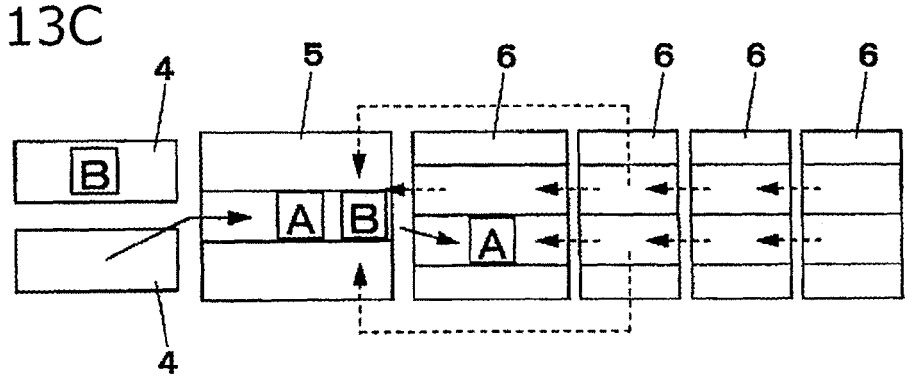

The screen printing apparatus 5 carries out the A substrate 2 on the carrying-out conveyer 15 to the first substrate carrying lane 72a on the basis of the substrate request signal output from the first component mounting apparatus 6, carries the B substrate subjected to the screen printing to the carrying-out conveyer 15 to be on standby, carries in the A substrate on the basis of the substrate request signal for the A substrate output from the second component mounting apparatus 6. The first component mounting apparatus 6 having received the A substrate from the screen printing apparatus 5 performs a component mounting-relevant operation (first operation step) on the A substrate (FIG. 13C).

Figure 14A:
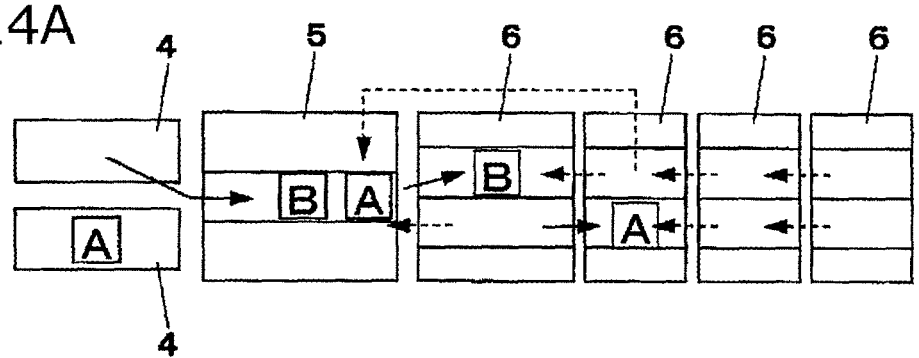
FIGS. 14A, 14B, and 14C are diagrams illustrating operations of the component mounting line according to the embodiment of the invention.

Thereafter, the screen printing apparatus 5 carries out the B substrate on the carrying-out conveyer 15 to the second substrate carrying lane 72b on the basis of the substrate request signal for the B substrate output from the first component mounting apparatus 6, and carries in the B substrate on the basis of the substrate request signal for the B substrate output from the second component mounting apparatus 6. In the meantime, the first component mounting apparatus 6 from the screen printing apparatus 5 carries out the A substrate subjected to the component mounting-relevant operation on the basis of the substrate request signal from the second component mount ing apparatus 6, and performs a component mounting-relevant operation (second operation step) on the B substrate received from the screen printing apparatus 5. The second component mounting apparatus 6 performs the component mounting-relevant operation (first operation step) on the received A substrate (FIG. 14A).

Figure 14B:
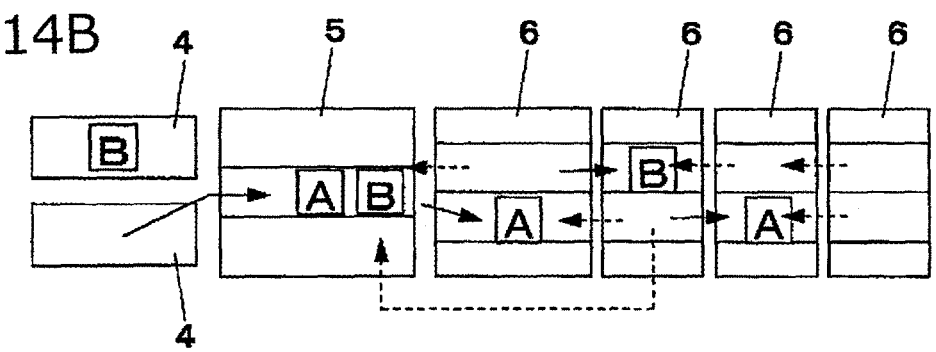
Figure 14C:
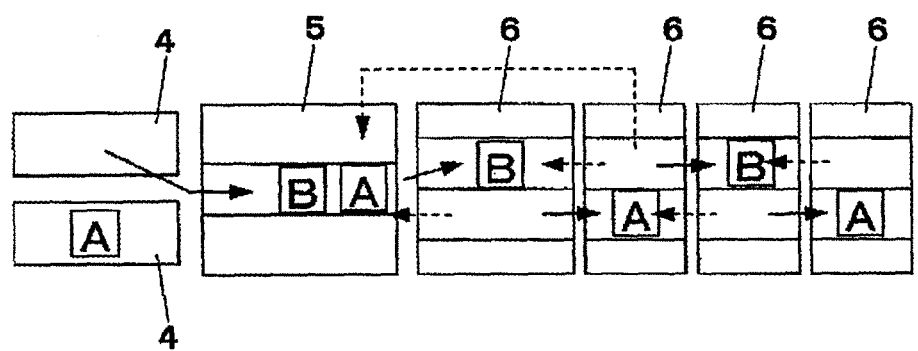

In this way, in the component mounting line 1, the substrate request signal for the A substrate and the substrate request signal for the B substrate are alternately output from the second component mounting apparatus 6 to the screen printing apparatus 5, and the screen printing apparatus 5 alternately carries in the A substrate and the B substrate, alternately perform the screen printing thereon, and alternately carries out the A substrate and the B substrate to the first component mounting apparatus 6 (FIG. 14B→FIG. 14C→FIG. 14B→FIG. 14C→FIG. 14B→ . . . ).

Figure 15A:
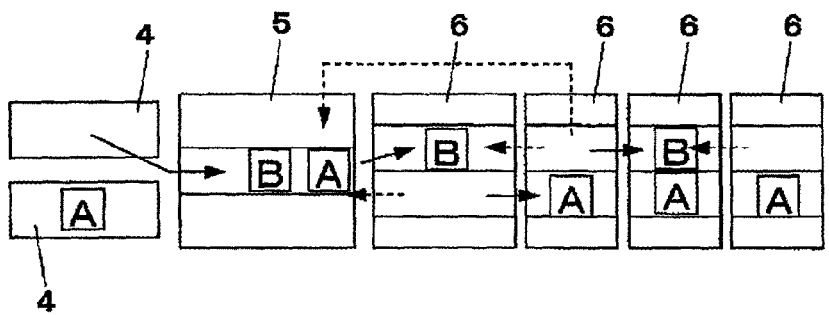
FIGS. 15A, 15B, 15C, and 15D are diagrams illustrating operations of the component mounting line according to the embodiment of the invention.

Here, during the manufacturing in the component mounting line 1, it is assumed that the flow of the A substrate in the component mounting apparatus 6 on the downstream side of the second component mounting apparatus 6 is delayed due to an error or the like (FIG. 15A). In this case, after the A substrate subjected to the screen printing is sent out to the first component mounting apparatus 6 (FIG. 15B), the screen printing apparatus 5 repeatedly performs the operations of carrying in the B substrate on the basis of the substrate request signal for the B substrate output from the second component mounting apparatus 6, performing the screen printing, and carrying out the B substrate (FIG. 15C→4 FIG. 15D→4 FIG. 15C→4 FIG. 15D→FIG. 15C→ . . . ). This is because the screen printing apparatus 5 selects the type of the substrate 2 to be carried in depending on whether a substrate is carried in the second component mounting apparatus 6 (on the basis of the substrate request signal output from the second component mounting apparatus 6 to the screen printing apparatus 5 as well as the first component mounting apparatus 6). Accordingly, when the flow of the A substrate on the side of the component mounting apparatus 6 is stopped, the screen printing apparatus 5 does not carry in the A substrate but carries in the B substrate. As a result, the component mounting line 1 does not stop the manufacturing of the B substrate.

Figure 15B:
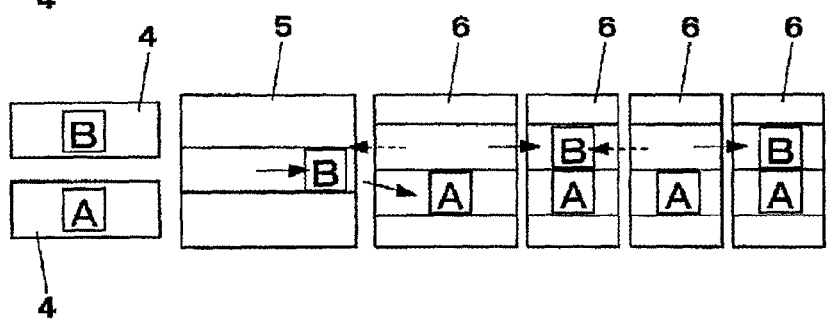
Figure 15C:
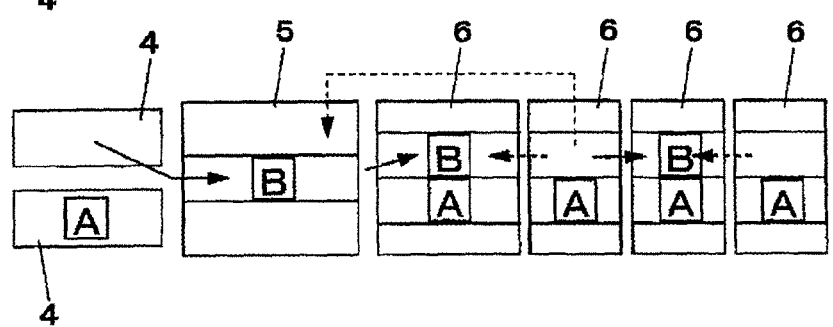
Figure 15D:
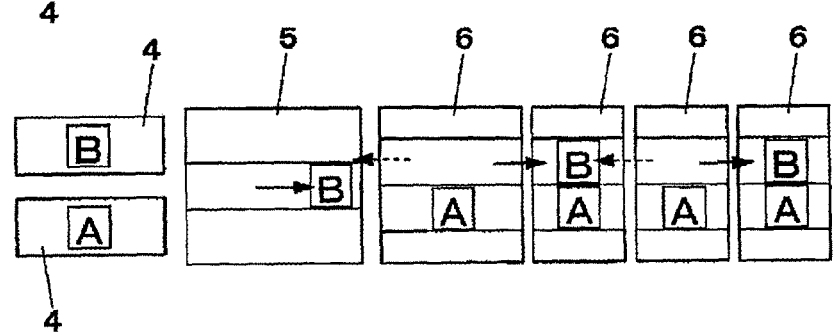

When the screen printing apparatus 5 alternately carries in the A substrate and the B substrate as in the related art, the A substrate is carried in the screen printing apparatus 5 in FIG. 15B. Then, after the screen printing apparatus 5 sends out the A substrate therein to the component mounting apparatus 6 on the immediate downstream side thereof, there is no place to which A newly carried A substrate is carried out and thus the manufacturing of the B substrate is stopped.

As described above, in the component mounting line 1 (component mounting method) according to this embodiment, the screen printing apparatus 5 selects the type of a substrate 2 to be carried in depending on whether a substrate is carried in the second component mounting apparatus 6 (more specifically, carries in the same type of substrate 2 as the type of the substrate of which the carrying-out is requested to the first component mounting apparatus 6 by the second component mounting apparatus 6). Accordingly, even when the flow of one type of substrate on the side of the component mounting apparatus 6 is stopped, a situation does not occur in which the type of substrate 2 stays in the screen printing apparatus 5 and cannot be carried out to the component mounting apparatus 6. Accordingly, the manufacturing of a substrate 2 in one substrate carrying lane 72 is not adversely affected because the carrying state of the one substrate carrying lane 72 is not abnormal but the substrate 2 cannot be carried out from the screen printing apparatus 5 to the one substrate carrying lane 72. As a result, it is possible to prevent degradation in productivity in one substrate carrying lane 72 in which the carrying is not stopped.

It is possible to provide a component mounting line and a component mounting method that can prevent degradation in the productivity in one substrate carrying lane even when carrying of a substrate in the other substrate carrying lane is delayed.

What is claimed is:

1. A component mounting line comprising:
   a screen printing apparatus that prints paste on a substrate; and
   a plurality of component mounting apparatuses that are arranged in series on a downstream side of the screen printing apparatus and perform a component mounting-relevant operation on the substrate on which the paste has been printed by the screen printing apparatus, wherein the screen printing apparatus includes
- a mask in which a first pattern-forming area in which a first pattern corresponding to a first type substrate is formed and a second pattern-forming area in which a second pattern corresponding to a second type substrate is formed are arranged in a predetermined pattern arrangement direction,
- a substrate support unit moving mechanism that moves a substrate support unit supporting a substrate in the pattern arrangement direction below the mask and that selectively brings the substrate into contact with one of the first pattern-forming area and the second pattern-forming area,
- a print head that prints the paste on the substrate selectively brought into contact with one of the first pattern-forming area and the second pattern-forming area by moving over the mask, and
- a controller that selects a type of the substrate to be carried in the screen printing apparatus depending on whether a substrate is carried in the second component mounting apparatus downstream from the screen printing apparatus, wherein each of the plurality of component mounting apparatuses includes a first substrate carrying lane and a second substrate carrying lane which are arranged in the pattern arrangement direction, carries the first type substrate on which the first pattern has been printed in the first substrate carrying lane, performs a component mounting-relevant operation on the first type substrate, carries the second type substrate on which the second pattern has been printed in the second substrate carrying lane, and performs a component mounting-relevant operation on the second type substrate, and wherein the screen printing apparatus selects a type of the substrate to be carried in depending on whether a substrate is carried in the second component mounting apparatus downstream from the screen printing apparatus.

2. The component mounting line according to claim 1, wherein the screen printing apparatus selects the type of a substrate carried in the substrate carrying lane having requested the substrate out of the two substrate carrying lanes of the second component mounting apparatus downstream from the screen printing apparatus as the type of the substrate carried in the screen printing apparatus.

3. A component mounting method in a component mounting line including a screen printing apparatus that prints paste on a substrate and a plurality of component mounting apparatuses that are arranged in series on the downstream side of the screen printing apparatus and perform a component mounting-relevant operation on the substrate on which the paste has been printed by the screen printing apparatus, the screen printing apparatus including a mask in which a first pattern-forming area in which a first pattern corresponding to a first type substrate is formed and a second pattern-forming area in which a second pattern corresponding to a second type substrate is formed are arranged in a predetermined pattern arrangement direction, a substrate support unit moving mechanism that moves a substrate support unit supporting a substrate in the pattern arrangement direction below the mask and that selectively brings the substrate into contact with one of the first pattern-forming area and the second pattern-forming area, a print head that prints the paste on the substrate selectively brought into contact with one of the first pattern-forming area and the second pattern-forming area by moving over the mask, each of the plurality of component mounting apparatuses including a first substrate carrying lane and a second substrate carrying lane which are arranged in the pattern arrangement direction, and a controller that selects a type of the substrate to be carried in the screen printing apparatus depending on whether a substrate is carried in the second component mounting apparatus downstream from the screen printing apparatus, the component mounting method comprising:
- a first operation step in which the each component mounting apparatus carries in the first type substrate on which the first pattern has been printed using the first substrate carrying lane and performs a component mounting-relevant operation on the first type substrate;
- a second operation step in which the each component mounting apparatus carries in the second type substrate on which the second pattern has been printed using the second substrate carrying lane and performs a component mounting-relevant operation on the second type substrate; and
- a selection step in which the screen printing apparatus selects the type of a substrate to be carried in depending on whether a substrate is carried in the second component mounting apparatus downstream from the screen printing apparatus.

4. The component mounting method according to claim 3, wherein, in the selection step, the type of a substrate carried in the substrate carrying lane having requested the substrate out of the two substrate carrying lanes of the second component mounting apparatus downstream from the screen printing apparatus is selected as the type of the substrate carried in the screen printing apparatus is set as.

* * * * *